(12) United States Patent
Ireland

(10) Patent No.: US 8,569,893 B2
(45) Date of Patent: *Oct. 29, 2013

(54) SELF-ALIGNED, INTEGRATED CIRCUIT CONTACT

(75) Inventor: Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 159 days.

This patent is subject to a terminal disclaimer.

(21) Appl. No.: 13/193,212

(22) Filed: Jul. 28, 2011

(65) Prior Publication Data

US 2011/0278738 A1 Nov. 17, 2011

Related U.S. Application Data

(60) Continuation of application No. 12/647,994, filed on Dec. 28, 2009, now Pat. No. 7,989,957, which is a continuation of application No. 10/854,891, filed on May 27, 2004, now Pat. No. 7,646,099, which is a division of application No. 10/232,214, filed on Aug. 29, 2002, now Pat. No. 6,780,762.

(51) Int. Cl.
*H01L 29/417* (2006.01)
*H01L 23/528* (2006.01)

(52) U.S. Cl.
USPC .................................. 257/774; 257/E23.145

(58) Field of Classification Search
USPC .......................................... 257/774, E23.145
See application file for complete search history.

(56) References Cited

U.S. PATENT DOCUMENTS

| | | |
|---|---|---|
| 5,466,639 A | 11/1995 | Ireland |
| 5,556,500 A | 9/1996 | Hasegawa et al. |
| 5,796,746 A | 8/1998 | Farnworth et al. |
| 5,798,299 A | 8/1998 | Chung |
| 5,935,451 A | 8/1999 | Dautartas et al. |
| 5,990,021 A | 11/1999 | Prall et al. |
| 6,103,623 A | 8/2000 | Lien et al. |
| 6,117,725 A | 9/2000 | Huang |
| 6,217,721 B1 | 4/2001 | Xu et al. |
| 6,303,492 B1 | 10/2001 | Rhodes et al. |
| 6,313,508 B1 | 11/2001 | Kobayashi |
| 6,348,411 B1 | 2/2002 | Ireland et al. |
| 6,353,269 B1 | 3/2002 | Huang |
| 6,420,257 B2 | 7/2002 | Ireland |
| 6,429,474 B1 | 8/2002 | Gambino et al. |
| 6,479,378 B1 | 11/2002 | Ireland |
| 6,492,734 B2 | 12/2002 | Watanabe |
| 6,531,352 B1 | 3/2003 | Sandhu et al. |
| 6,686,288 B1 | 2/2004 | Prall et al. |
| 6,686,648 B2 | 2/2004 | Gebauer et al. |

(Continued)

FOREIGN PATENT DOCUMENTS

GB 2171360 8/1986

OTHER PUBLICATIONS

Wolf, S., et al., "Silicon Processing for the VLSI Era", vol. 1—Process technology, second edition, Lattice Press, Sunset beach, ISBN:0-9616721-6-1, (2000), 207.

*Primary Examiner* — Evan Pert
(74) *Attorney, Agent, or Firm* — Schwegman, Lundberg & Woessner, P.A.

(57) ABSTRACT

This document discusses, among other things, example systems including integrated circuit contacts configured to reduce the likelihood of shorting to unrelated portions of overlying conductive material due to contact misalignment.

20 Claims, 10 Drawing Sheets

(56) References Cited

U.S. PATENT DOCUMENTS

| | | |
|---|---|---|
| 6,696,359 B1 | 2/2004 | Ireland |
| 6,780,762 B2 * | 8/2004 | Ireland .......................... 438/640 |
| 7,646,099 B2 * | 1/2010 | Ireland .......................... 257/774 |
| 7,989,957 B2 * | 8/2011 | Ireland .......................... 257/774 |
| 2001/0035547 A1 | 11/2001 | Isogai |
| 2001/0053612 A1 | 12/2001 | Juengling |
| 2002/0066914 A1 | 6/2002 | Imai et al. |
| 2002/0086517 A1 | 7/2002 | Barth et al. |
| 2004/0041263 A1 | 3/2004 | Ireland |
| 2010/0096672 A1 | 4/2010 | Ireland |

* cited by examiner

SELF-ALIGNED, INTEGRATED CIRCUIT CONTACT

PRIORITY AND RELATED APPLICATIONS

This application claims the benefit of priority, and is a continuation application, of U.S. application Ser. No. 12/647,994, filed Dec. 28, 2009 now U.S. Pat. No. 7,989,957, which is a continuation application of U.S. application Ser. No. 10/854,891, filed May 27, 2004, now issued as U.S. Pat. No. 7,646,099, which is a divisional application of U.S. application Ser. No. 10/232,214, filed Aug. 29, 2002, now issued as U.S. Pat. No. 6,780,762, each of which are incorporated herein by reference in their entirety.

BACKGROUND

The integrated circuit industry continues to progress in electronic circuit densification and miniaturization. This progress has resulted in increasingly compact and efficient semiconductor devices, which in turn enable the systems into which these devices are incorporated to be made smaller and less power consumptive.

Integrated circuits are fabricated with devices that have microscopic features that can only be manufactured with processing steps that require careful equipment alignment and timing. The manufacturing costs of integrated circuits are expensive because: (1) the processing steps must be accomplished with costly and sophisticated equipment and experienced operators; and (2) such steps are not always successful. For example, if the processing equipment, such as a mask, is inadvertently misaligned, then the integrated circuit may be fabricated incorrectly and fail. As a result, processing yields decrease and production costs increase. Therefore, to reduce manufacturing costs, a fabrication process that has enhanced process margins is desirable. Such a process would permit successful fabrication of integrated circuits, despite minor misalignments.

A typical integrated circuit includes a semiconductive substrate, upon which active and passive devices are formed. These devices are encapsulated in insulating material, and patterned conductive layers are formed over the insulating material to carry signals to the devices. Conductive contacts are used to electrically connect the devices with the overlying conductive layers. These contacts extend vertically downward through the insulating material to connect the conductive layers with doped regions on the substrate or with portions of the devices. Accordingly, these contacts are often referred to as "contacts to silicon" or "contacts to substrate." The patterned conductive layers, in turn, can be connected to other conductive layers through vias or other conductive structures.

During fabrication, the active and passive devices are first formed on the semiconductor substrate, and are encapsulated by the insulating material. Openings are then formed in the insulating material, and conductive contact material (e.g., tungsten or doped polysilicon) is deposited in these openings to form the contacts. An etching procedure is then commonly performed to remove unwanted contact material from the top surface of the insulating material.

A conductive layer of a different material (e.g., aluminum) is then formed over the insulating material and contacts. The conductive layer is then patterned and etched, using an etching process that selectively etches the material of the conductive layer. The result is a conductive layer with traces overlying and connecting with the top surfaces of the contacts.

Portions of the conductive layers or structures (e.g., contacts) that are supposed to be electrically connected are referred to as "related metals." This is distinguishable from "unrelated metals," which refers to portions of the conductive layers or structures that are supposed to be electrically isolated from each other. Unrelated metals typically carry independent signals.

Because the contacts and conductive traces are formed during different processing steps, it is necessary to tightly control the photolithography and etching processes so that each contact sufficiently connects with its corresponding, related metal portion within the patterned conductive layer. For example, the photomask used during the photolithography process must be precisely aligned, the timing of the duration of the etching process must be accurate, and the steppers must be tightly controlled. If these or other sub-processes are not sufficiently accurate, then one or more contacts may provide a short between unrelated metals within the overlying conductive layer, causing device failure or performance degradation.

FIG. 1 illustrates a side, cross-sectional view of a portion of a semiconductor wafer after a successful etch of an overlying conductive layer, where a contact 102 accurately connects with a related, first metal portion 104 of the conductive layer. The conductive layer includes first metal portion 104 and second metal portion 106. Metal portions 104 and 106 are adjacent to each other within the same patterned layer, and are electrically isolated from each other by insulating material 108. For the purposes of this description, metal portions 104 and 106 are unrelated metals.

When accurately aligned, the top surface of contact 102 is connected with the first metal portion 104. The contact 102 also is formed in an insulating material 110, and thus is electrically isolated from the second metal portion 106. The likelihood that contact 102 will short to the second metal portion 106 is dependent on the distance 112 through the insulating material 110 between the contact 102 and the second metal portion 106. Because the distance 112 between the contact 102 and the second metal portion 106 is relatively long in terms of the processing technology de jure, in the example illustrated in FIG. 1, a low likelihood exists that a short will develop across contact 102 to unrelated metal portion 106.

FIG. 2 illustrates a side, cross-sectional view of a portion of a semiconductor wafer after unsuccessful processing of an overlying conductive layer, where first metal portion 204 of the conductive layer is inaccurately aligned with a related contact 202. As with the example illustrated in FIG. 1, first metal portion 204 and second metal portion 206 are unrelated metals. Because the distance 212 between the contact 202 and second metal portion 206 is relatively short, a much higher likelihood exists that a short will develop across contact 202 to the unrelated metal 206. This may result in device failure or possibly impact device performance negatively.

As device sizes continue to decrease, the margin of error in alignment and etching process timing also decreases, making it more difficult to accurately align the metal portions in the overlying conductive layers with their corresponding contacts. As explained above, the photolithography and etching processes for patterning the conductive layers must be tightly controlled, and as immune as possible to process variations that may negatively affect the accuracy of these processes. For example, in a robust process having sufficient process margin, the accuracy of the photolithography and etching processes should not be affected by normal process variations. Such variations could include, for example, ambient conditions, vibration, which particular stepper or etcher is used, whether or not the fabrication chamber had been cleaned or otherwise disturbed, who the operator was who entered the processing parameters into the computer, or other process noise that inherently occurs minute-to-minute, day-to-day.

Accordingly, what are needed are processes that are more robust, which will result in higher manufacturing yields and will enable device sizes to continue to be decreased. In particular, what are needed are processes that are more tolerant of misalignments that might occur while masking and etching an integrated circuit's conductive layers, thus reducing the incidence of shorting between these unrelated metal portions. Also needed is an interconnect structure (e.g., a contact) that accurately self-aligns with its corresponding, related metal portion.

DESCRIPTION OF THE EMBODIMENTS

Figure 1:
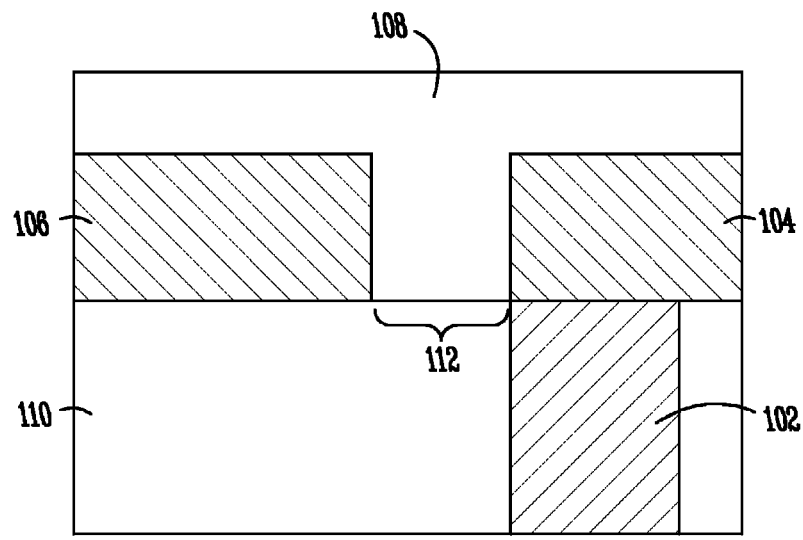
FIG. 1 illustrates a side, cross-sectional view of a portion of a semiconductor wafer after a successful etch of an overlying conductive layer, where a contact accurately connects with a first metal portion of the conductive layer.
Figure 2:
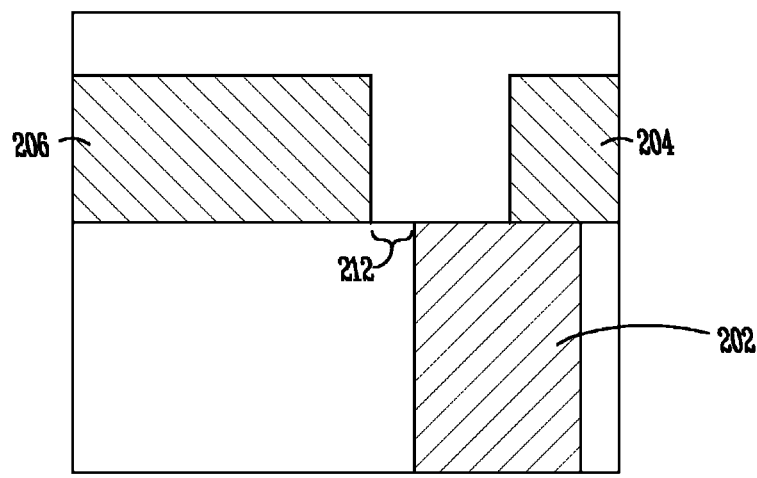
FIG. 2 illustrates a side, cross-sectional view of a portion of a semiconductor wafer after unsuccessful processing of an overlying conductive layer, where a first metal portion of the conductive layer is inaccurately aligned with a contact.

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. It will be recognized that the methods of the various embodiments can be combined in practice, either concurrently or in succession. Various permutations and combinations will be readily apparent to those skilled in the art.

Terminology

The terms "wafer" and "substrate" used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor, as well as other semiconductor support structures that are new or are well known to one skilled in the art. Furthermore, when reference is made to a wafer or substrate in the following description, previous process steps may have been utilized to form regions/junctions in the base semiconductor structure.

The terms "horizontal" and "vertical" are used to explain the relative orientations of particular views. For the purposes of this description, assuming a semiconductor wafer or device is laid flat along a horizontal plane, a "top-down" or "horizontal" view of the device indicates a view of the device from above. Conversely, a "side" or "vertical" view of the device indicates a view of the device from the side. In the figures, any cut-away view is referred to as a "cross-sectional" view. An "elevational" view is a view of an exterior surface.

The term "contact" used in the following description includes a conductive contact formed between a semiconductor substrate or device and an overlying conductive layer. With modifications that would be apparent to those of skill in the art based on the description herein, the embodiments of the invention also can be applied to plugs, vias, trenches, and other vertical interconnect structures. Therefore, the term "contact" can be construed to include these structures as well. The following detailed description is, therefore, not to be taken in a limiting sense, and the scope of the present invention is defined only by the appended claims.

Self-Aligned Contacts within Semiconductor Devices

In one embodiment of the present invention, contacts are used as electrical interconnect structures between a patterned, conductive layer and a semiconductor substrate, plug or device. Using processing methods described later in accordance with various embodiments, a contact related etching process is performed in conjunction with the conductive layer etch. The contact related etch removes exposed portions of the contacts that extend toward unrelated metal portions of the overlying conductive layer.

The contacts of the various embodiments can be formed in submicron dimensions, with a substantial reduction in the likelihood that misalignments between the contacts and their related metal portions in the overlying conductive layer will result in shorts between unrelated metal portions in the metal layer. Accordingly, the processes of the various embodiments are more robust, enabling increasingly miniaturized devices to be fabricated with higher yields and improved performance.

In one embodiment, contacts are used to interconnect portions of an overlying metal layer with cells of a memory device, such as a DRAM (Dynamic Random Access Memory). A typical DRAM includes an array of memory cells. The memory cells are arranged in an array and each cell has an address identifying its location in the array. The array includes a configuration of intersecting conductive lines, and memory cells are associated with the intersections of the lines. In order to read from or write to a cell, the particular cell in question must be selected or addressed. The address for the selected cell is represented by input signals to a word line decoder and to a digit line decoder. The word line decoder activates a word line in response to the word line address. The selected word line activates the access gates for each of the memory cells in communication with the selected word line. The digit line decoder selects a digit line pair in response to the digit line address. For a read operation, the selected word line activates the access gates for a given word line address, and data is latched to the digit line pairs.

Figure 3:
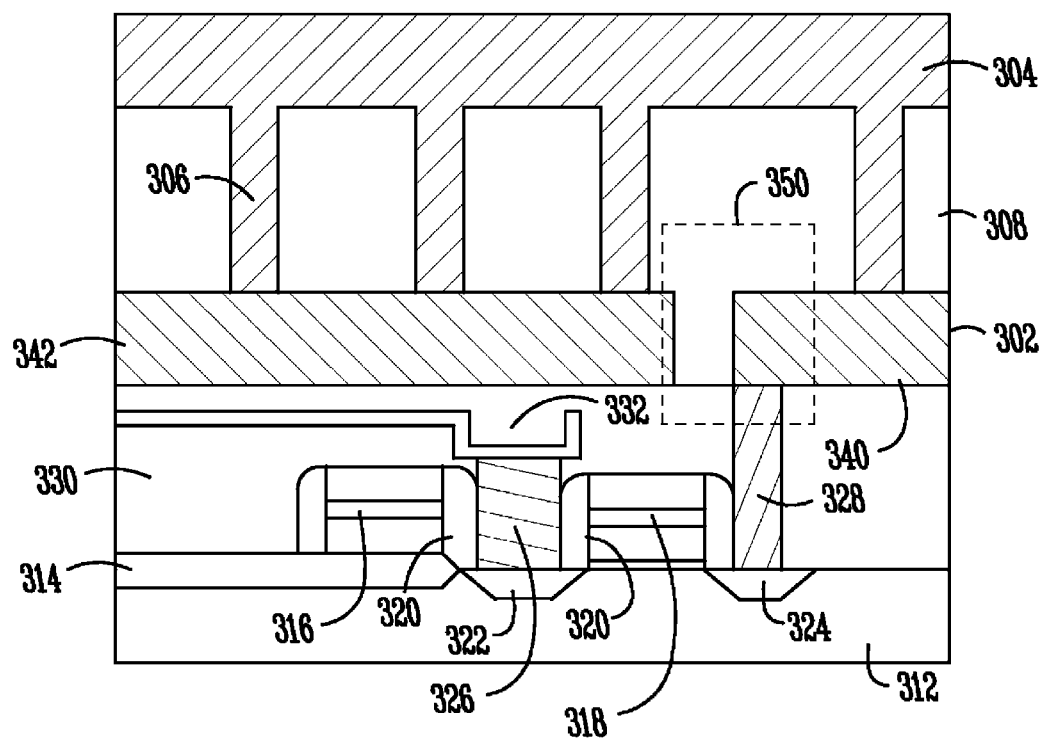
FIG. 3 illustrates a side, cross-sectional view of portion of a semiconductor device in accordance with an embodiment of the present invention.

FIG. 3 illustrates a side, cross-sectional view of a portion of a semiconductor device, which includes a DRAM memory cell. A DRAM cell generally consists of a capacitor coupled through a transistor to a digit line. Transistor 318 is activated when a signal is provided to doped node region 324 through a conductive contact 328. When activated, transistor 318 allows data to be stored into or retrieved from capacitive structure 332.

The wafer fragment illustrated in FIG. 3 includes a semiconductive material 312, field oxide region 314, and wordlines 316, 318. Spacers 320 are adjacent wordlines 316, 318. Node locations 322, 324 are adjacent to wordlines 316, 318, and are diffusion regions within semiconductive material 312.

Conductive structures 326, 328 extend upward from node locations 322, 324 into or through insulating material 330. The upper surface of conductive structure 326 contacts a capacitor construction 332, which serves to store a bit of information.

Conductive structure 328 is formed though insulating material 330, and serves as a contact to metal layer 302, which includes the digit line to the memory cell. During operation, the capacitor construction 332 is electrically connectable to contact 328 through a transistor gate comprised by wordline 318. In an alternate embodiment, conductive contact 328 can make contact with a polysilicon plug (not shown), rather than directly contacting node 324.

The intersection of contact 328 and metal layer 302 is indicated in region 350. Contact 328 connects with a related portion 340 of metal layer 302, and is intended to be electrically isolated from an unrelated portion 342 of metal layer 302. As will be described in more detail later, the process for manufacturing the device includes an additional etching step, after patterning metal layer 302, which serves to increase the distance between contact 328 and unrelated metal portion 342 of metal layer 302, in accordance with an embodiment of the invention.

In one embodiment, some or all digit lines are provided within first metal layer 302. The first metal layer 302, in turn, is electrically connected to second metal layer 304 through vias 306, which function as vertical interconnect structures through a dielectric layer 308. The second metal layer 304 serves to carry voltage signals that are transmitted to and received from the first metal layer 302 through vias 306. Other dielectric and/or metal layers and vias could exist above the second metal layer 304, as well.

It will be understood that the above description of a DRAM cell is intended to provide a general understanding of the memory and is not a complete description of all the elements and features of a DRAM. Although the description shows how embodiments of the present invention are implemented in a DRAM, interconnect structures (e.g., contacts 328) fabricated using the embodiments of the invention could be used to provide electrical interconnections within other types of devices, as well. For example, the embodiments of the present invention could be implemented in other types of memory devices, microprocessors, Application Specific Integrated Circuits (ASICs) or virtually any other semiconductor device having two or more metal layers. In particular, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs.

Method of Forming Self-Aligned Contacts

Figure 4:
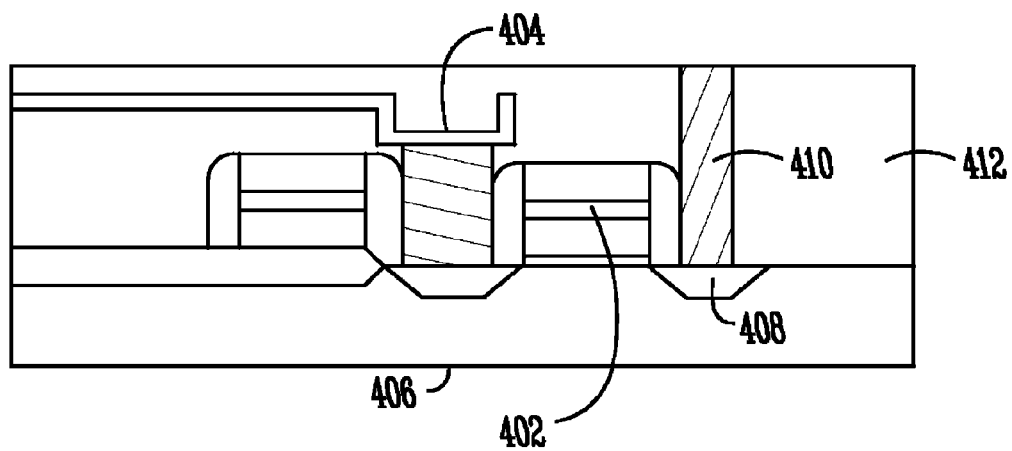
FIGS. 4-6 are side, cross-sectional views of a portion of a semiconductor device during various processing stages in accordance with an embodiment of the invention.
Figure 5:
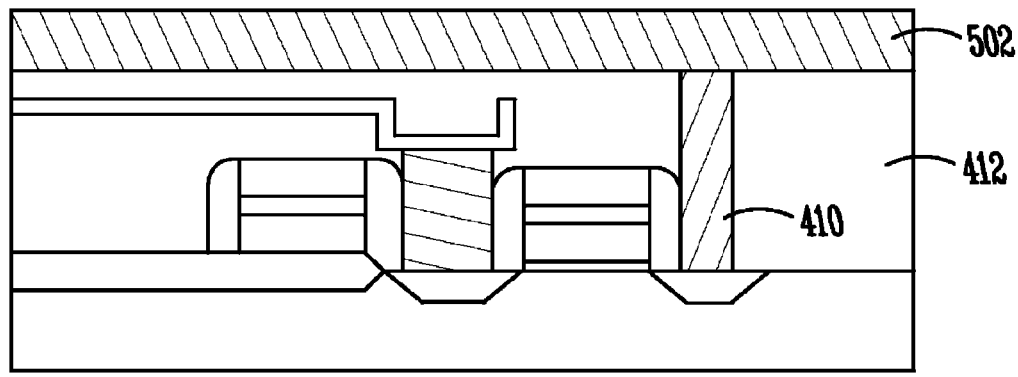
Figure 6:
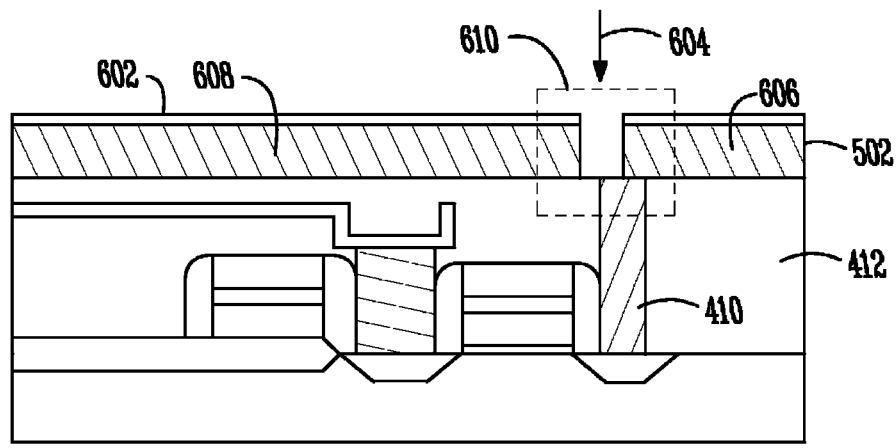

FIGS. 4-6 are side, cross-sectional views of a portion of a semiconductor device during various processing stages in accordance with an embodiment of the invention. For illustration purposes, these figures depict the formation of a portion of a DRAM memory device, and a single memory cell is illustrated.

To begin the process, a portion of a semiconductor device is formed, as illustrated in FIG. 4. In the example embodiment, the portion of the semiconductor device is a DRAM memory cell, which includes a transistor 402 and a capacitive structure 404 formed on a semiconductor substrate 406. A detailed description of the processes used to form the illustrated semiconductor device portion is outside the scope of this patent, and such processes are well known to those of skill in the art.

Basically, forming the illustrated semiconductor device portion involves forming MOS devices (e.g., transistor 402) and nodes (e.g., node 408) on the substrate 406 using a sequence of material deposition, doping, and etching processes. Insulating material 412 is then deposited over the MOS devices and nodes. In one embodiment, insulating material 412 is formed from tetraethyloxysilicate (TEOS) and/or borophosphosilicate glass (BPSG), although silicon oxide or other suitable materials could be used, as well. Conventionally, the TEOS and BPSG are used to form capacitors in the DRAM. In addition, the insulating material 412 could include additional dielectric formed on top of the TEOS and BPSG, to create a capacitor container and an insulator between contacts (e.g., contact 410). The additional dielectric could be a nitride, an oxide, or a combination thereof.

In one embodiment, the insulating material 412 is planarized after deposition of the BPSG and/or additional dielectric materials, and before formation of a contact opening (i.e., an opening in which contact 410 will be formed). Preferably, chemical-mechanical polishing (CMP) is used, resulting in a substantially flat topology on the top surface of the device. The flat topology permits patterning the contact opening with lithography equipment having a reduced field of depth. Other mechanical or non-mechanical smoothing techniques may also be used, such as alternative etch processes (e.g., reactive ion etching) or chemical dissolution. In another alternate embodiment, these planarization processes are not performed.

A contact opening is then etched through the insulating material 410 to an underlying area of the semiconductor device, using a conventional photolithographic and etching procedure. In one embodiment, after patterning a photoresist material above insulating material 412, an anisotropic reactive ion etching (RIE) process is used to etch the contact holes. For example, $CHF_3$, $CF_4$ or $C_4F_8$ could be used as etchants, although other materials could be used, as well. In alternate embodiments, an isotropic etching process could be used.

After the contact opening is etched through the insulating material 410, an adhesive and barrier layer (not shown) are deposited in the contact opening. In one embodiment, deposition of these layers is accomplished using chemical vapor deposition (CVD) (e.g., CVD, low pressure CVD (LPCVD), atmospheric pressure CVD (APCVD) or plasma enhanced CVD (PECVD)) procedures. In alternate embodiments, a physical vapor deposition (PVD) process could be used, which is also known as sputtering. The adhesive and barrier layer materials can include, for example, an underlying titanium adhesive layer, at a thickness between about 50 to 500 angstroms, and an overlying titanium nitride barrier layer, at a thickness between about 100 to 1000 angstroms.

Next the contact material is deposited, completely filling the contact hole and forming contact 410. In one embodiment, the contact material is tungsten, which is deposited using a PVD process to a thickness between about 2000 to 8000 angstroms. In other embodiments, the contact material could be polysilicon, aluminum, tungsten silicide, tungsten polycide, tungsten hexafluoride/silane, titanium silicide or other suitable materials, and or the contact material could be deposited using CVD (e.g., CVD, LPCVD, APCVD or PECVD) or some other process. Also, the contact material could be thicker or thinner than the above stated range. An etching or other material removal procedure (e.g., a chemical mechanical procedure) is then performed to remove unwanted contact material from the top surface of the insulating material 412, in one embodiment.

The width or diameter of the contact is in a range of about 0.2-0.35 microns, in one embodiment, although the width could be greater than or less than this range, as well. When completed, the contact has a horizontal, cross-sectional area that is roughly circular, although the cross-sectional area could have other shapes, as well, depending on the mask pattern used during the contact opening etch process.

After contact 410 is formed, a top surface of contact 410 is exposed at the top surface of the insulating material 412, so that the contact 410 can subsequently be electrically connected to one or more conductive layers above the memory cell. Accordingly, contact 410 either extends to the top of or above insulating material 412, or an opening is formed in insulating material 412, thus exposing the top portion of contact 410.

After the portion of the semiconductor device is formed, a conductive layer 502 is deposited above (e.g., on the top surface of) the insulating material 412 and contact 410, as illustrated in FIG. 5. This conductive layer is referred to herein as the first metal layer, or the "M1" layer. The M1 layer 502 comes into physical and electrical contact with conductive contact 410.

In one embodiment, the M1 layer 502 includes three layers of conductive material, which are sequentially deposited using standard deposition techniques (e.g., CVD, LPCVD, and/or PVD). The lowest layer includes titanium, and has a thickness in a range of about 80-120 angstroms, with a thickness of about 100 angstroms being present in one embodiment. The middle layer includes an aluminum/copper alloy, and has a thickness in a range of about 2500-3500 angstroms, with a thickness of about 3000 angstroms being present in one embodiment. The top layer includes titanium nitride, and has a thickness in a range of about 200-300 angstroms, with a thickness of about 250 angstroms being present in one embodiment.

In other embodiments, the titanium, aluminum, and titanium nitride layers could be thicker or thinner than the ranges specified above. In still other embodiments, the M1 layer 502 could include more or fewer conductive layers (e.g., from 1 to 10), or those layers could be formed from different materials (e.g., copper), or those layers could be arranged in a different configuration (e.g., a titanium nitride layer could exist as the bottom layer).

After depositing the conductive material of the M1 layer 502, portions of the layer are selectively removed, as illustrated in FIG. 6, thus exposing portions of the top surface of the insulating material and portions of any misaligned contacts 410. First, a layer of photoresist material 602 is deposited above the M1 layer 502. The resist layer 602 is formed from a material that is light or energy sensitive, such that resist material receiving exposure will have physical characteristics different from resist material not receiving exposure. Such resist materials are typically reactive to a specific set or range of energy types (e.g., a specific set or range of wavelengths of light).

In one embodiment, the resist layer 602 is formed from an antireflection coating material, which is a dark material that helps in the imaging and patterning of M1 layer 502. This coating also can slow later etching processes down, in some cases. In one embodiment, the antireflection coating is formed from siliconoxynitride. In other embodiments, numerous other photoresist compositions (e.g., titanium nitride) and technologies could be used.

A reticle or mask is placed over the resist layer 602 in order to selectively block waves directed toward the surface of the resist layer. The resist layer 602 is then exposed to electromagnetic radiation or light waves, typically UV light, of a type capable of exposing the resist material in the resist layer. In one embodiment, the resist layer contains photoresist material of a positive type (i.e., that which is more easily removed, or more vulnerable to solvents, when exposed to light or energy). Exposed resist portions are then removed using conventional washing techniques (e.g., washing with a solution of aqueous TMAH), leaving portions of the M1 layer 502 uncovered. In an alternate embodiment, a negative type photoresist could be used (i.e., that which is more resistant to removal, when exposed to light or energy, than unexposed areas of the resist). In the latter embodiment, the mask or reticle would be appropriately and obviously modified.

After the photoresist is selectively removed, a patterned layer of resist 602 remains on the top surface of M1 layer 502. Uncovered portions of M1 layer 502 are then modified and removed, resulting in the formation of M1 opening 604.

In one embodiment, the uncovered portions of the M1 layer 502 are removed using an anisotropic RIE procedure at a pressure between about 6 to 20 mtorr, although other etching procedures and/or pressures outside this range could alternatively be used. This involves applying a first etching compound to the remaining photoresist and the uncovered portions of the M1 layer 502. The first etching compound selectively etches the conductive material within the M1 layer 502. In one embodiment, the first etching compound is a chlorine based etchant, having an etch chemistry comprised of between about 20 to 80% chlorine, and between about 20 to 80% $BCl_3$. Additive reactants, such as argon, nitrogen, $CHF_3$, and $CH_4$, between about 0 to 40%, can also be included in the etching ambient. Numerous other etching materials, such as $Cl_2$, for example, could be used in other embodiments. The selection of the particular material used depends on the conductive material forming the M1 layer, the speed of the desired etch, the materials at which the etch should terminate, and other factors. In various embodiments, anisotropic, isotropic, wet or dry etches, or a combination of these types of etches could be used.

The use of the described etch chemistry, with an etch rate selectivity allowing a greater removal rate for the M1 layer material than for the contact materials, allows the end point to easily be established with the appearance of contact 410. Accordingly, the etching process is timed to terminate about when the top of the contact 410 and the insulating material 412 is exposed with sufficient over-etch to cover normal production variations for M1-to-M1 shorts. This results in the formation of openings, such as opening 604, which separate unrelated portions 606, 608 of the M1 layer 502.

In one embodiment, remaining resist portions 602 are then removed using techniques well known to those of skill in the art, such as plasma oxygen ashing and careful wet cleans. In other embodiments, the remaining resist portions remain on the surface of the patterned M1 layer 502 or are removed at a later time. For ease of illustration, remaining resist portions are not illustrated in the figures that follow.

In some cases, mask misalignments can make spatial tolerances worse during the M1 layer photolithography process, a portion of the top of contact 410 also is exposed. Area 610 of the device of FIG. 6 is enlarged, in FIGS. 7-8 and 12, which are side, cross-sectional views showing an enlarged view of a contact 410 and an overlying conductive layer 606, 608 during various processing stages in accordance with an embodiment of the invention.

Figure 7:
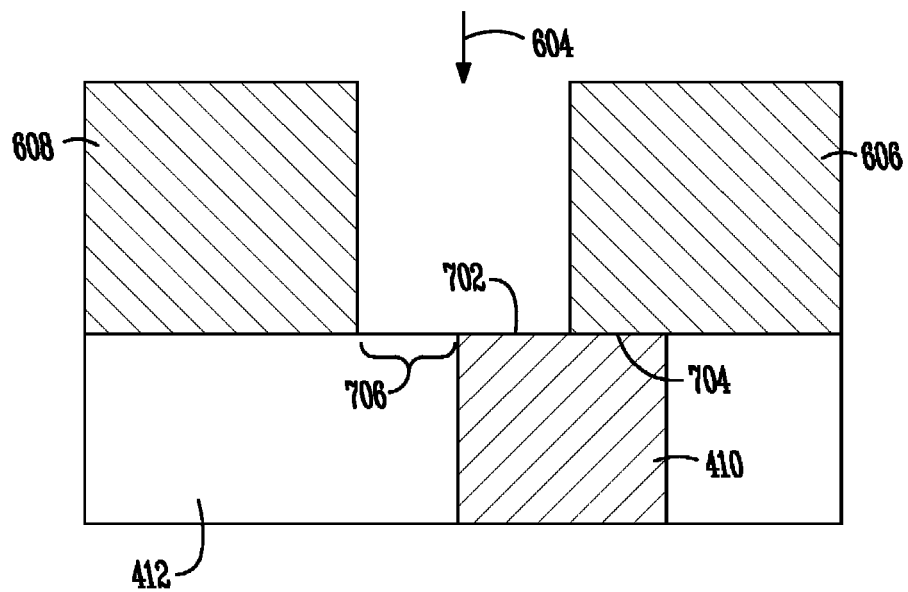
FIGS. 7-8 are side, cross-sectional views of an enlarged portion of the semiconductor device of FIG. 6, showing an enlarged view of a contact and an overlying conductive layer during various processing stages in accordance with an embodiment of the invention.

Specifically, FIG. 7 illustrates a side, cross-sectional view of a contact 410 having a first top surface portion 702 that is exposed within opening 604 due to a misalignment of the M1 photolithography process. This top surface portion 702 extends toward unrelated portion 608 of the M1 layer. Contact 410 also has a second top surface portion 704 that underlies related portion 606 of the M1 layer.

As described previously, portion 608 of the M1 layer is unrelated metal to both contact 410 and portion 606 of the M1 layer, for the purposes of this description. Accordingly, it is desirable to avoid shorting portion 606 to portion 608 across contact 410. The likelihood that a short will develop depends primarily on the shortest distance 706 between contact 410 and unrelated M1 portion 608 across insulating material. The magnitude of this distance 706 is a function of the original layout and the amount of misalignment present in the M1 photolithography process. In addition, small fragments of contact material and notches may reduce or breach the distance between contact 410 and unrelated M1 portion 608.

Figure 8:
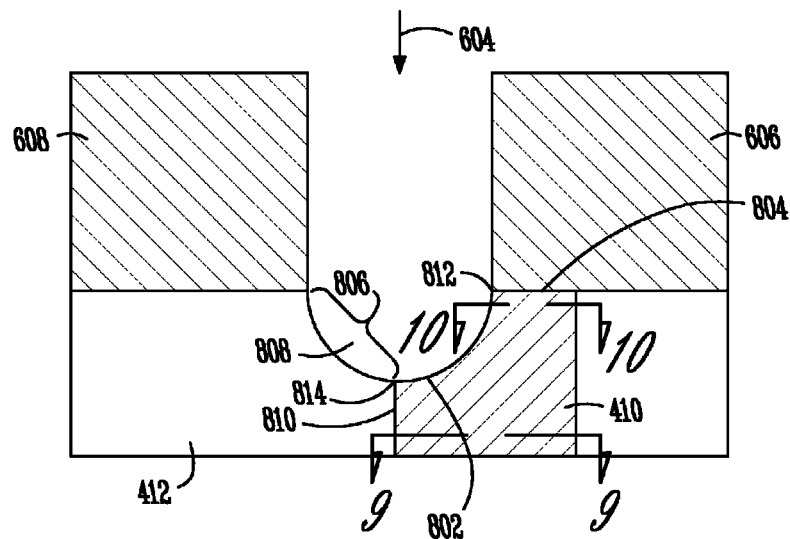

In accordance with an embodiment of the present invention, a contact related etch is performed after the M1 layer etch in order to remove a portion of contact 410 and increase the shortest distance between contact 410 and unrelated portion 608 of the M1 layer. FIG. 8 illustrates a side, cross-sectional view of the enlarged contact 410 of FIG. 7, after a portion of the contact 410 has been selectively removed in accordance with an embodiment of the invention.

In one embodiment, this etch is an anisotropic RIE procedure at a pressure between about 6 to 20 mtorr, although other etching procedures and/or pressures outside this range could alternatively be used. During this process, the patterned M1 layer acts as a mask, thus protecting underlying portions of contact 410 and eliminating the need for a separate photoresist process. In an alternate embodiment, the resist material used during the M1 layer etch could be retained on the top surface of the M1 layer at least until the contact related etch is completed. In still another alternate embodiment, a new resist layer could be applied, patterned, and selectively removed from the areas where the contact related etch is desired.

In order to perform the contact related etch, a second etching compound that preferentially etches the contact material is applied within contact opening 604. The second etching compound selectively etches the conductive material within contact 410, along with any adhesive and barrier layers (not shown). In one embodiment, the second etching compound also selectively etches insulating material 412. In another embodiment, the second etching compound does not substantially etch insulating material 412.

In one embodiment, the second etching compound includes nitrogen trifluoride ($NF_3$), which readily etches tungsten and other materials. Numerous other etching materials could be used in other embodiments. For example, etchants containing a halogen compound, $SF_3$, $SF_6$, $Cl_2$, $C_2F_6$ or other materials also could be used. The selection of the particular material used depends on the conductive material forming the contact, the speed of the desired etch, and other factors. In various embodiments, a wet etch, dry etch, or a combination of these types of etches could be used.

The etching process is timed to terminate after the shortest distance 806 between contact 410 and unrelated portion 608 of the M1 layer has been increased sufficient to buy back margin loss due to misalignment. This decreases the likelihood that a short will develop across contact 410 between unrelated portions 606, 608 of the M1 layer. In one embodiment, the process is terminated before a significant amount of contact material is removed from the contact surface 804 that physically connects to related portion 606 of the M1 layer, although some of this contact material could be removed while still maintaining the electrical integrity of the device.

In one embodiment, the contact related etching process is terminated when a depression 808 that spans the distance between the unrelated metal portions 606, 608 is formed, where the depression 808 has a concave and roughly half-circular perimeter. Accordingly, the exposed surface 802 of contact 410 also is concave between its top surface 804 and its side surface 810. In other embodiments, the depression 808 could have a more triangular perimeter (i.e., the exposed surface 802 of contact 410 would be roughly straight between the contact's top surface 804 and the side surface 810).

Figure 9:
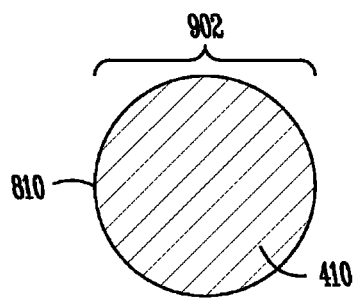
FIG. 9 is a top-down, cross-sectional view of a contact below an etched notch in accordance with an embodiment of the invention.

The contact related etching process results in a contact 410 having a horizontal top surface 804, a vertical side surface 810, and a notch defined by a non-horizontal and non-vertical surface 802 extending between point 812 on the top surface 804 and point 814 on the vertical side surface 810. Below the notch, the horizontal cross-sectional area of the contact is roughly circular in one embodiment, as depicted in FIG. 9, which illustrates a top-down, enlarged, cross-sectional view of the contact 410 of FIG. 8 when cut through cross-section lines 9-9. In one embodiment, the diameter 902 of the contact 410 is in a range of about 0.2-0.35 microns, although the diameter could be larger or smaller in other embodiments.

Figure 10:
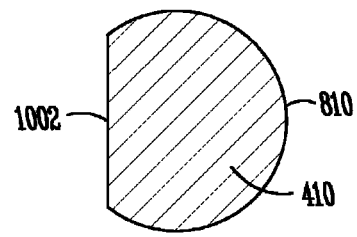
FIG. 10 is a top-down, cross-sectional view of a contact above an etched notch in accordance with an embodiment of the invention.

Above the notch, the horizontal cross-sectional area of the contact is roughly circular with one straight edge 1002 that is defined by a line that bisects the circular cross section, in one embodiment, as depicted in FIG. 10, which illustrates a top-down, enlarged, cross-sectional view of the contact 410 of FIG. 8 when cut through cross-section lines 10-10. In other embodiments, where the contact 410 does not normally have a circular, horizontal cross-sectional area, but has a cross-sectional area of another shape instead (e.g., rectangular, square, oval, or multi-sided), the shapes depicted in FIGS. 9 and 10 would look accordingly different.

Figure 11:
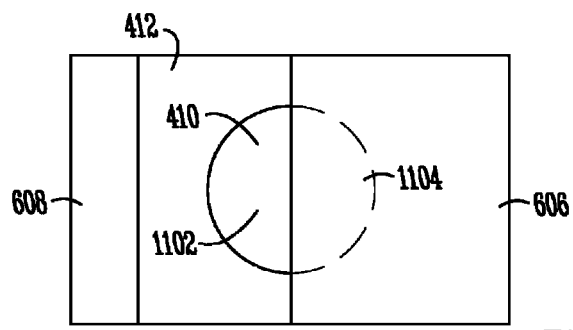
FIG. 11 is a top-down, elevational view of portions of a conductive layer and an underlying contact that has been exposed and etched in accordance with an embodiment of the invention.

FIG. 11 is a top-down, elevational view of portions 606, 608 of a conductive layer and the surface of a contact 410 that has been exposed and etched in accordance with an embodiment of the invention. When viewed from the top, a part 1102 of the surface of contact 410 is exposed. Another part 1104 of the surface of contact 410 is underneath and hidden by related portion 606 of the M1 layer, as indicated by dashed lines. In one embodiment, after the contact related etch is completed, both the exposed part 1102 of the contact and exposed portions of the dielectric 412 within which the contact 410 is located are partially removed, forming a depression (see depression 808, FIG. 8) between portions 606 and 608 of the M1 layer.

In the above described sequence of processes, the M1 etch and the contact related etch are performed sequentially as separate processes, where the first etching compound used in the M1 etch is selective to the M1 layer materials, but is not selective to the contact material, and where the second etching compound is not selective to the M1 layer materials but is selective to the contact material. In another embodiment, the first and second etching compounds are combined together, so that the M1 layer etch and the contact related etch occur within the same processing step.

Figure 12:
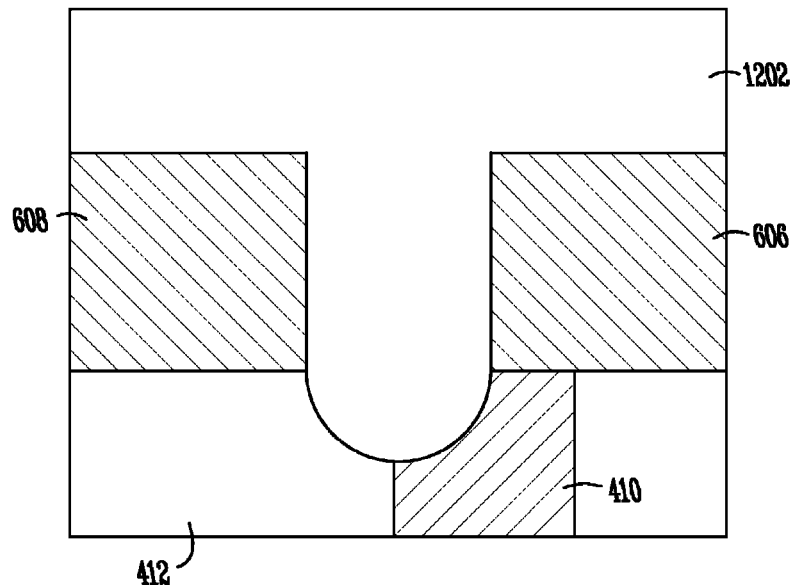
FIG. 12 is another side, cross-sectional view of an enlarged portion of the semiconductor device of FIG. 6, showing an enlarged view of a contact and an overlying conductive layer in accordance with an embodiment of the invention.

After completing the contact related etch, an interlayer dielectric (ILD) material is deposited above the M1 layer 606, 608 and into the contact opening, thus filling the depression (e.g., depression 808, FIG. 8) between unrelated M1 layer portions 606, 608. FIG. 12 illustrates a side, cross-sectional view of the device portion of FIG. 8, after ILD material 1202 has been deposited over the M1 layer 606, 608 and into the contact opening. Deposition of ILD 1202 is performed in a manner known to persons skilled in the art.

In one embodiment, ILD 1202 is formed from tetraethyloxysilicate (TEOS). ILD 1202 has a thickness in a range of about 4500-5500 angstroms, with a thickness of about 5000 angstroms being present in one embodiment. In other embodiments, ILD 1202 could be formed from other suitable dielectric materials, and could be thicker or thinner than the range specified above. For example, ILD 1202 could include other insulating materials, such as oxides or nitrides.

Figure 13:
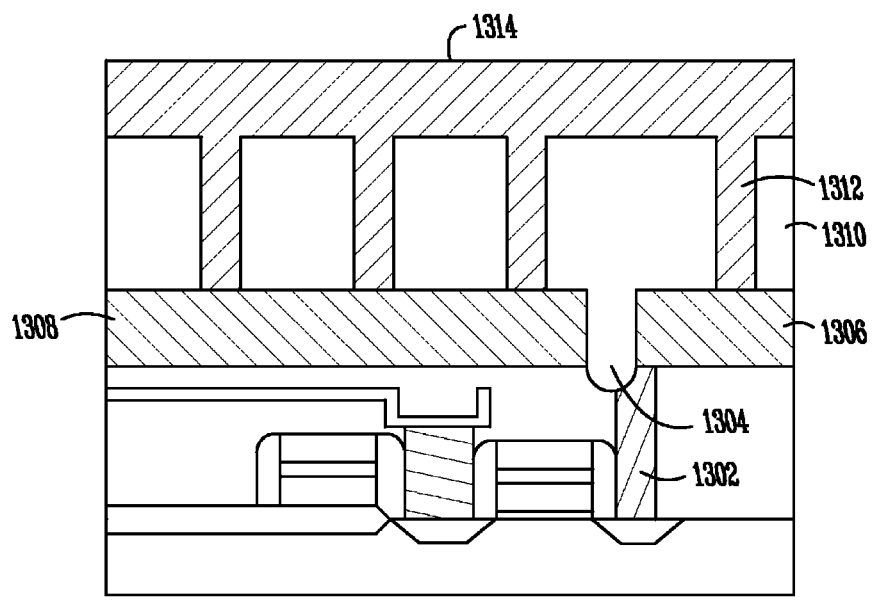
FIG. 13 is a side, cross-sectional view of a portion of a semiconductor device with a modified contact in accordance with an embodiment of the invention.

Subsequent processing steps can then be performed to form interconnections with the M1 layer and to complete the integrated circuit. FIG. 13 is a side, cross-sectional view of a portion of a semiconductor device with a modified contact 1302 in accordance with an embodiment of the invention. Specifically, the portion of the semiconductor device is a DRAM memory cell, although contacts or interconnects formed using the embodiments of the present invention could be implemented in other types of memory cells or devices, as well.

As FIG. 13 illustrates, contact 1302 is modified so that a depression 1304 exists between unrelated portions 1306, 1308 of the M1 layer. The depression 1304 is filled with ILD material 1310, which also forms a dielectric layer above the M1 layer. In one embodiment, after ILD 1310 has been deposited, it is planarized using a chemical-mechanical polishing (CMP) process to smooth the top surface. Smoothing the top surface of ILD 1310 has been shown to improve the overall performance of the device. Other mechanical or non-mechanical smoothing techniques may also be used, such as alternative etch processes (e.g., RIE) or chemical dissolution. In another embodiment, the top surface is not planarized.

Conductive vias 1312 are formed through ILD 1310, providing interconnections between the M1 layer 1306, 1308 and another overlying, patterned conductive layer 1314, sometimes referred to as the M2 layer. The M2 layer 1314 and vias 1312 are formed using techniques and materials well known to those of skill in the art. After patterning the M2 layer 1314, one or more additional layers of dielectric and conductive material can be built on top of the M2 layer 1314 (e.g., M3, M4, etc.). In addition, interconnects between the M1, M2, and/or the new conductive layers can be formed. Alternatively, a passivation layer can be formed on top of the M2 layer 1314, after which the device build-up process can be considered to be essentially complete.

The memory cells described above can form a portion of a memory device, in accordance with various embodiments. This memory device can be, for example, a DRAM, SRAM, Flash memory or other type of memory device. Alternatively, the self-aligned contacts and their formation methods, described in conjunction with the various embodiments above, can be integrated into another type of device (e.g., a microprocessor or ASIC).

Memory Devices

Figure 14:
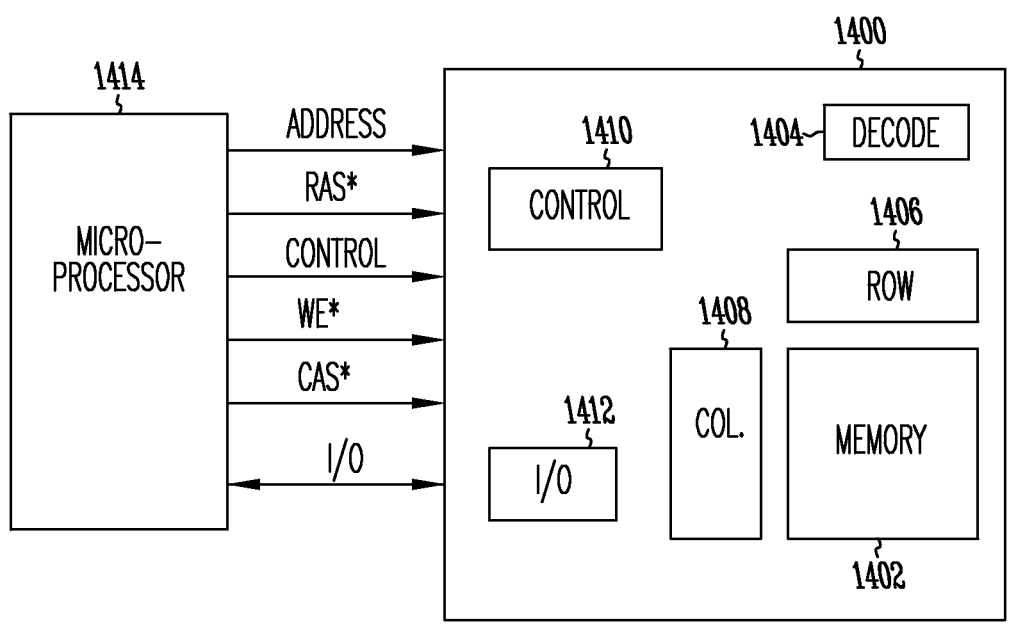
FIG. 14 is a simplified block diagram of an integrated circuit memory device in accordance with an embodiment of the invention.

FIG. 14 is a simplified block diagram of an integrated circuit memory device according to one embodiment of the invention. In one embodiment, memory cells, such as those described in conjunction with FIGS. 3 and 13, are suitable for use in memory devices. Other types of memory cells having structures well understood in the art are also suitable for use in memory devices.

The memory device 1400 includes an array of memory cells 1402, address decoder 1404, row access circuitry 1406, column access circuitry 1408, control circuitry 1410, and Input/Output circuit 1412. The memory can be coupled to an external microprocessor 1414, or memory controller for memory accessing. The memory receives control signals from the processor 1414, such as WE*, RAS* and CAS* signals. The memory is used to store data which is accessed via I/O lines. It will be appreciated by those skilled in the art that additional circuitry and control signals can be provided, and that the memory device of FIG. 14 has been simplified to help focus on the invention. The memory device is formed using techniques described above, in accordance with the various embodiments of the invention.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

Semiconductor Dies

Figure 15:
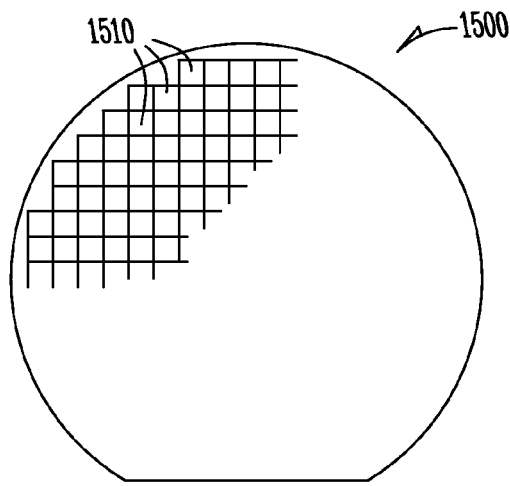
FIG. 15 is a top-down, elevation view of a wafer containing semiconductor dies in accordance with an embodiment of the invention.

FIG. 15 is a top-down, elevation view of a wafer 1500 containing semiconductor dies 1510 in accordance with an embodiment of the invention. A die is an individual pattern, typically rectangular, on a substrate that contains circuitry, or integrated circuit devices, to perform a specific function. At least one of the integrated circuit devices includes a modified contact, embodiments of which are disclosed herein. A semiconductor wafer will typically contain a repeated pattern of such dies containing the same functionality. Die 1510 may contain circuitry for the inventive memory device, as discussed above. Die 1510 may further contain additional circuitry to extend to such complex devices as a monolithic processor with multiple functionality. Die 1510 is typically packaged in a protective casing (not shown) with leads extending therefrom (not shown) providing access to the circuitry of the die for unilateral or bilateral communication and control.

Circuit Modules

Figure 16:
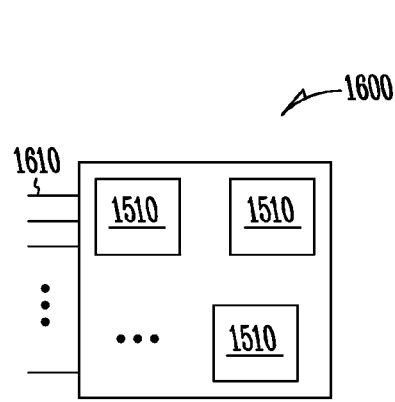
FIG. 16 is a simplified block diagram of an exemplary circuit module in accordance with an embodiment of the invention.

FIG. 16 is a simplified block diagram of an exemplary circuit module 1600 in accordance with an embodiment of the invention. As shown in FIG. 16, two or more dies 1510 may be combined, with or without protective casing, into circuit module 1600 to enhance or extend the functionality of an individual die 1510. Circuit module 1600 may be a combination of dies 1510 representing a variety of functions, or a combination of dies 1510 containing the same functionality. Some examples of a circuit module include memory modules, device drivers, power modules, communication modems, processor modules, and application-specific modules and may include multilayer, multichip modules. Circuit module 1600 may be a subcomponent of a variety of electronic systems, such as a clock, a television, a cellular or radio communication device (e.g., cell phone, pager, etc.), a desktop, handheld or portable computer, an automobile, an industrial control system, an aircraft, an automated teller machine, and others. Circuit module 1600 will have a variety of leads 1610 extending therefrom and coupled to the dies 1510 providing unilateral or bilateral communication and control.

Figure 17:
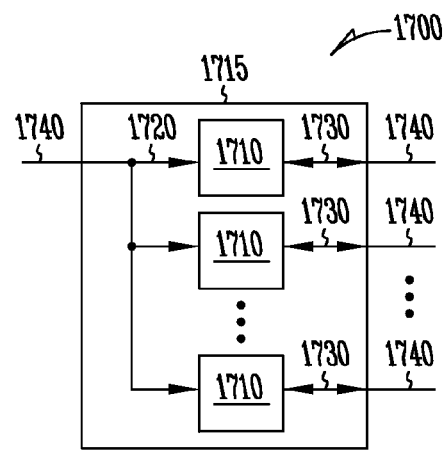
FIG. 17 is a simplified block diagram of an exemplary memory module in accordance with an embodiment of the invention.

FIG. 17 is a simplified block diagram of an exemplary memory module 1700, which is one embodiment of a circuit module. Memory module 1700 generally depicts a Single Inline Memory Module (SIMM) or Dual Inline Memory Module (DIMM). A SIMM or DIMM is generally a printed circuit board (PCB) or other support containing a series of memory devices. While a SIMM will have a single in-line set of contacts or leads, a DIMM will have a set of leads on each side of the support with each set representing separate I/O signals. Memory module 1700 contains multiple memory devices 1710 contained on support 1715, the number depending upon the desired bus width and the desire for parity. Memory module 1700 may contain memory devices 1710 on both sides of support 1715. Memory module 1700 accepts a command signal from an external controller (not shown) on a command link 1720 and provides for data input and data output on data links 1730. The command link 1720 and data links 1730 are connected to leads 1740 extending from the support 1715. Leads 1740 are shown for conceptual purposes and are not limited to the positions shown in FIG. 17.

Electronic Systems

Figure 18:
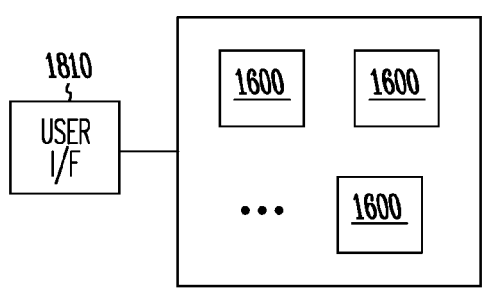
FIG. 18 is a simplified block diagram of an exemplary electronic system in accordance with an embodiment of the invention.

FIG. 18 is a simplified block diagram of an exemplary electronic system 1800 in accordance with an embodiment of the invention. Electronic system 1800 contains one or more circuit modules 1600. Electronic system 1800 generally contains a user interface 1810. User interface 1810 provides a user of the electronic system 1800 with some form of control or observation of the results of the electronic system 1800. Some examples of user interface 1810 include a keyboard, pointing device, monitor, and printer of a computer; a keypad, speaker, microphone, and display of a communication device; a tuning dial, display, and speakers of a radio; an ignition switch and gas pedal of an automobile; and a card reader, keypad, display, and currency dispenser of an automated teller machine. User interface 1810 may further describe access ports provided to electronic system 1800. Access ports are used to connect an electronic system to the more tangible user interface components previously exemplified.

One or more of the circuit modules 1600 may be a processor providing some form of manipulation, control or direction of inputs from or outputs to user interface 1810, or of other information either preprogrammed into, or otherwise provided to, electronic system 1800. As will be apparent from the lists of examples previously given, electronic system 1800 will often contain certain mechanical components (not shown) in addition to circuit modules 1600 and user interface 1810. It will be appreciated that the one or more circuit modules 1600 in electronic system 1800 can be replaced by a single integrated circuit. Furthermore, electronic system 1800 may be a subcomponent of a larger electronic system.

Figure 19:
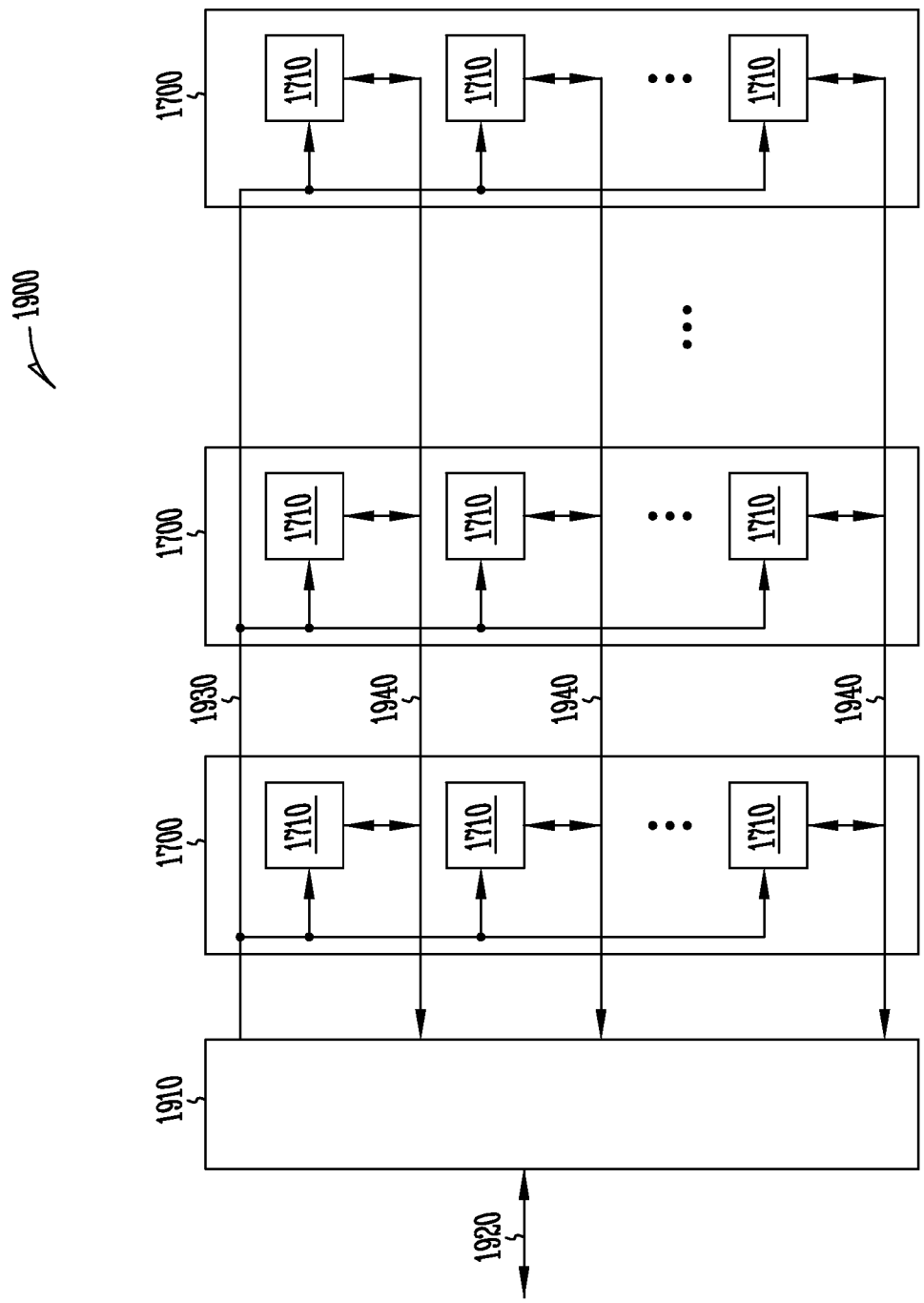
FIG. 19 is a simplified block diagram of an exemplary memory system in accordance with an embodiment of the invention.

FIG. 19 is a simplified block diagram of an exemplary memory system 1900, which is one embodiment of an electronic system. Memory system 1900 contains one or more memory modules 1700 and a memory controller 1910. Memory controller 1910 provides and controls a bidirectional interface between memory system 1900 and an external system bus 1920. Memory system 1900 accepts a command signal from the external bus 1920 and relays it to the one or more memory modules 1700 on a command link 1930. Memory system 1900 provides for data input and data output between the one or more memory modules 1700 and external system bus 1920 on data links 1940.

Figure 20:
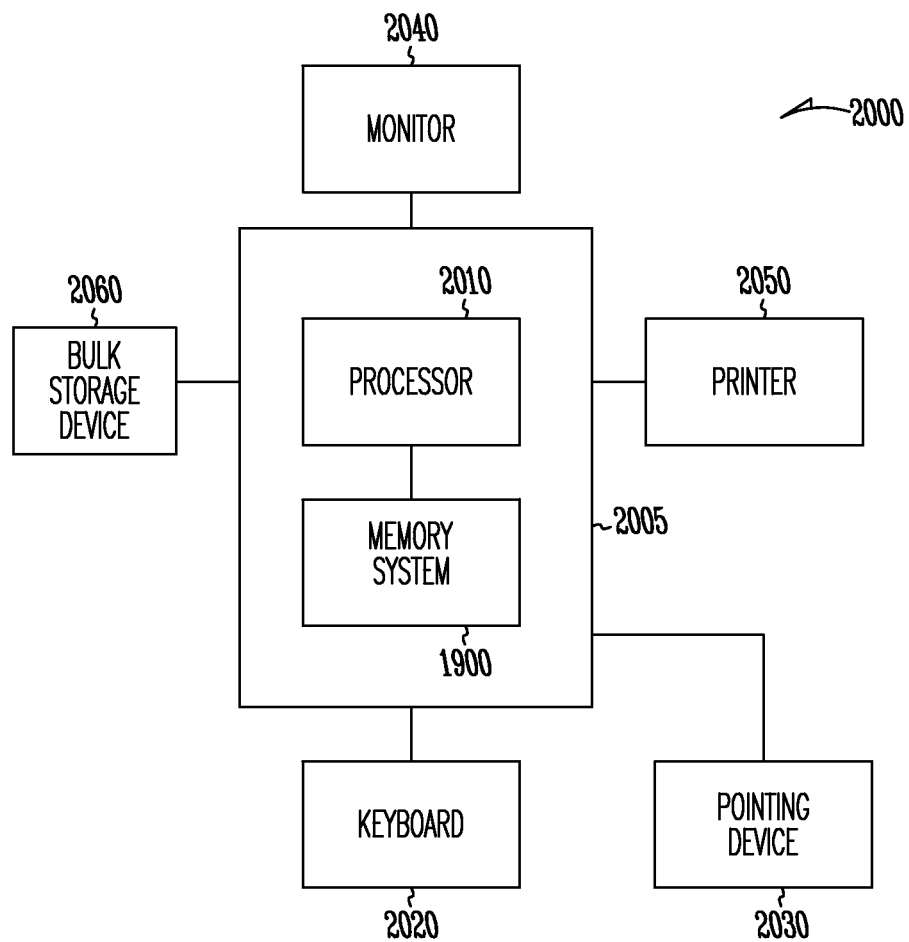
FIG. 20 is a simplified block diagram of an exemplary computer system in accordance with an embodiment of the invention.

FIG. 20 is a simplified block diagram of an exemplary computer system 2000, which is a further embodiment of an electronic system. Computer system 2000 contains a processor 2010 and a memory system 2000 housed in a computer unit 2005. Computer system 2000 is but one example of an electronic system containing another electronic system (e.g., memory system 1900) as a subcomponent. Computer system 2000 optionally contains user interface components. Depicted in FIG. 20 are a keyboard 2020, a pointing device 2030, a monitor 2040, a printer 2050, and a bulk storage device 2060. It will be appreciated that other components are often associated with computer system 2000 such as modems, device driver cards, additional storage devices, etc. It will further be appreciated that the processor 2010 and memory system 1900 of computer system 2000 can be incorporated on a single integrated circuit. Such single package processing units reduce the communication time between the processor and the memory circuit.

CONCLUSION

When misalignments are present during photolithography processes used to form prior art integrated circuits, these circuits may suffer from contact shorts between unrelated portions of a metal layer. These shorting problems affect the manufacturing yields, and restrict the ability to further miniaturize integrated circuits because of constraints that must be placed on the photolithography processes.

Embodiments of the present invention provide a contact structure, which is formed using a method that removes material that extends toward unrelated metal, thus increasing the distance between a misaligned contact and the unrelated metal. This decreases the likelihood that a short across a misaligned contact will develop between unrelated portions of an overlying conductive layer. Accordingly, the methods of the various embodiments result in processes with higher margins, and higher manufacturing yields.

While the invention has been described and illustrated with respect to forming contacts to a memory cell, it should be apparent that the same processing techniques can be used to form vias and other connectors, that interconnect with other conductive layers. The process used for forming a via is very similar. The difference is well known in the art and consists of the fact that the via, rather than interconnecting a semiconductor structure and a metal layer, typically interconnects two metal layers. In addition, the methods of the various embodiments can be used for other applications besides memory cells. Modifications that would be apparent to those of skill in the art could be made to the methods of the various embodiments to apply the methods to other integrated circuits, integrated circuit packages, interposers, printed circuit boards, and other structures that include vertical interconnect structures that are formed from material that is different from the material of an overlying conductive layer.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An electronic system comprising:
   a processor; and
   an integrated circuit die coupled to the processor, the integrated circuit die including an interconnect structure, the interconnect structure including:
     an insulation material;
     a conductive material overlaying the insulation material;
     a conductive interconnect disposed in an opening of the insulation material and underlying a portion of the conductive material, the conductive interconnect comprising:
       a horizontal top surface connected to the conductive material;
       a vertical side surface; and
       a notch defined by a non-horizontal and non-vertical surface extending between the top surface and the side surface; and
     a dielectric material connected to the non-horizontal and non-vertical surface defining the notch of the conductive interconnect.

2. The electronic system of claim 1, wherein on a first side of the notch, a horizontal cross-sectional area of the contact is roughly circular, and on a second side of the notch, the horizontal cross-sectional area of the contact includes a roughly circular portion and an edge defined by a line that substantially bisects the horizontal cross-sectional area.

3. The electronic system of claim 1, wherein the integrated circuit die further comprises:
   a node region connected to a bottom surface of the contact opposite the horizontal top surface of the contact.

4. The electronic system of claim 3, wherein the node region comprises a doped node.

5. The electronic system of claim 3, wherein the contact is configured to pass a signal to activate a transistor connected to the node region.

6. The electronic system of claim 1, wherein the contact includes tungsten.

7. The electronic system of claim 1, wherein the contact includes aluminum.

8. The electronic system of claim 1, further comprising:
   a user interface device coupled to the processor.

9. The electronic system of claim 8, wherein the user interface device comprises:
   a card reader.

10. The electronic system of claim 8, wherein the user interface device comprises:
    at least one of an ignition switch or a gas pedal.

11. An integrated electronic system comprising:
    a processor; and
    a memory circuit having a plurality of leads coupled to the processor, the memory circuit including a memory cell, the memory cell including:
      an insulating material forming a surface of the integrated memory cell;
      a contact within a contact opening in the insulating material, the contact including:
        a horizontal top surface;
        a vertical side surface; and
        a notch defined by a non-horizontal and non-vertical surface extending between the horizontal top surface and the vertical side surface;
      a conductive material overlaying the contact and contacting the horizontal top surface of the contact; and
      a dielectric material connected to the non-horizontal and non-vertical surface defining the notch of the contact.

12. The integrated electronic system of claim 11, wherein the non-horizontal and non-vertical surface is concave between the horizontal top surface and the vertical side surface.

13. The integrated electronic system of claim 11, wherein the non-horizontal and non-vertical surface is roughly a planar, angled surface between the horizontal top surface and the vertical side surface.

14. The integrated electronic system of claim 11, wherein proximate to the notch, a horizontal cross-section area of the contact is roughly circular.

15. The integrated electronic system of claim 11, wherein, proximate to the notch, a horizontal cross-section area of the contact includes a roughly circular portion and one edge defined by a line that bisects the horizontal cross-section.

16. The integrated electronic system of claim 11, including a node region connected to the contact, wherein the node region is connected at a bottom surface of the contact opposite the substantially horizontal top surface.

17. The integrated electronic system of claim 16, wherein the node region includes a node of a metal-oxide semiconductor (MOS) device of the memory cell.

18. The integrated electronic system of claim 11, including an access port coupled to the processor.

19. The integrated electronic system of claim 18, wherein the access port is configured to couple to at least one of a card reader, a display monitor, a currency dispenser, a keypad, or a speaker.

20. The integrated electronic system of claim 18, wherein the access port is configured to couple to at least one of an ignition switch or an acceleration pedal.

* * * * *